United States Patent [19]
Waller, Jr.

[11] Patent Number: 4,893,099
[45] Date of Patent: Jan. 9, 1990

[54] EXTENDED RESPONSE DYNAMIC NOISE REDUCTION SYSTEM

[76] Inventor: James K. Waller, Jr., 1633 Star Batt Dr., Rochester, Mich. 48309

[21] Appl. No.: 928,543

[22] Filed: Nov. 10, 1986

Related U.S. Application Data

[63] Continuation-in-part of Ser. No. 705,356, Feb. 25, 1985, Pat. No. 4,647,876.

[51] Int. Cl.$^4$ ............................................. H03H 7/01
[52] U.S. Cl. ..................................... 333/17.1; 381/98; 381/106
[58] Field of Search ............... 333/14, 17 R; 381/106, 381/94, 98

[56] References Cited
U.S. PATENT DOCUMENTS

| | | | |
|---|---|---|---|
| 3,885,111 | 5/1975 | Ishigami et al. | 333/14 X |
| 4,368,435 | 1/1983 | Bloy | 381/98 X |
| 4,696,044 | 9/1987 | Waller, Jr. | 381/106 |

*Primary Examiner*—Paul Gensler
*Attorney, Agent, or Firm*—Frank J. Catalano

[57] ABSTRACT

A noise reduction system compresses an input signal at a constant ratio in response to a control signal derived from the compressed signal. Added to the derived control signal is a counterfeit control signal which causes the compressor to mistrack when the compressed signal falls below a preselected threshold level. Thus, low level compressor output signals are increasingly deemphasized. A constant counterfeit control signal produces a logarithmic decrease in compressor output signal levels below the threshold point. The resulting compressed signal is used to enhance system noise reduction. The input signal is fed to a filter having a variable bandwidth controlled by a signal derived from the compressed signal and responsive to compressed signal frequency and amplitude so that the filter is desensitized to input signal amplitude changes. A multistage filter control signal arrangement may be employed to provide variable cutoffs in more than one bandwidth.

23 Claims, 3 Drawing Sheets

EXTENDED RESPONSE DYNAMIC NOISE REDUCTION SYSTEM

This application is a continuation-in-part of a parent application, U.S. Ser. No. 705,356 filed Feb. 25, 1985, which has since become a patent, U.S. Pat. No. 4,647,876 issued Mar. 3, 1987.

BACKGROUND

This invention relates generally to non-complementary or single ended noise reduction systems and more particularly concerns non-complementary noise reduction systems incorporating dynamically controlled filtering.

Present audio technology is such that even modest systems are capable of accurate reproduction over the entire audio bandwidth. Consequently, background noise presents a problem in almost every audio application, including tape and disc recording and playback, radio and television broadcasting and electronic musical instrument and signal processing.

The relationship of dynamic range to noise reduction in both live and recorded material is of growing significance. Noise awareness is dramatically increased when little or no signal is present to mask the noise within a given portion of the audio spectrum. Dynamically controlled low pass and high pass filters have long been used to reduce noise in high and low segments of the audio spectrum. One such system presently in use applies only the principles of dynamically controlled low pass filtering and provides no reduction of noise in the low frequency portion of the audio spectrum. Others use both low and high pass filtering and thus narrow the bandwidth to mid-audio range frequencies, but this still permits noise to be carried through the system which would be audible in the absence of mid-frequency information.

Systems do exist which utilize dynamically controlled variable bandwidth low pass filtering. These existing systems, however, suffer from a wide range of problems or side effects. The range of response in the filter section is generally limited. That is, at low signal levels the amplitude of the signal is not sufficient to open the dynamic filter to pass all of the high frequency audio information, resulting in a severe loss of high frequency response. Furthermore, a 6 dB per octave filter is generally used to limit the amount of attenuation in the high frequency spectrum, but when signal levels exceed the optimal operating level the dynamic filter is held open at all times. Thus, no noise reduction is obtained at high signal levels and at times a breathing effect is produced.

SUMMARY

In view of these limitations experienced with known systems, this invention provides a non-complementary noise reduction system which, among its objectives, affords an extended dynamic range in its dynamically controlled filter section allowing filter operation at both extremely low and extremely high signal levels and a higher level of attenuation on the order of 12 to 18 db per octave without a loss of frequency response. A correlated objective of the invention is to provide a system simultaneously responsive to both signal level and signal frequency in reducing noise over a maximized frequency range.

In accordance with the invention, an extended response dynamic noise reduction system is provided in which the dynamic range of the input signal is compressed to half its original range. The unity gain point of the compressor is selected so that the level of signals below the desired operating level of the system will be increased and the level of signals above the desired operating level of the system will be decreased prior to input to the dynamic filter control circuits. Thus, low level signals can appear high enough to the filter control circuits to be processed and high level signals can appear low enough to the filter control circuits to avoid holding the filters open with midfrequency signals. The compressor utilizes a threshold control preselecting the level at which low level signals are no longer fully compressed. That is, below this level, the compressor deviates from the 2 to 1 compression ratio.

BRIEF DESCRIPTION OF THE DRAWINGS

Other objects and advantages of the invention will become apparent upon reading the following detailed description and upon reference to the drawings in which.

DETAILED DESCRIPTION

Figure 1:
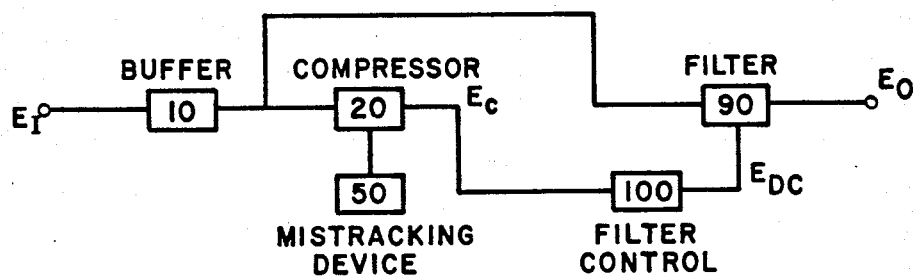
FIG. 1 is a block diagram of an embodiment of the present invention using only dynamically controlled low pass filtering.

The block diagram of the preferred dynamic noise reduction system is illustrated in FIG. 1. The system includes an input buffer 10 through which the input signal $E_I$ is fed to a compressor 20. The compressor 20 is adapted to compress the input signal $E_I$ at a constant 2 to 1 ratio. A mistracking device 50, however, causes the compressor 20 to compress the input signal $E_I$ at a variably decreasing ratio when the input signal $E_I$ falls below a preselected threshold level.

The input signal $E_I$ is also fed to a dynamically controlled low pass filter 90 which reduces its bandwidth in the absence of high frequency information. The low pass filter 90 is a voltage controlled filter, various types of which are currently available.

The dynamic control for the low pass filter 90 is derived from the compressed signal output $E_C$ of the compressor 20 by the filter control signal system 100. Thus the low level sensitivity of the filter 90 is responsive to the mistracking device 50. The system 100 is designed to provide an output D.C. control signal $E_{DC}$ which increases in response to increases in frequency or amplitude of the compressed signal $E_C$. Thus, the frequency band passed by the low pass filter 90 will expand in response to frequency and amplitude increases in the input signal $E_I$.

Figure 2:
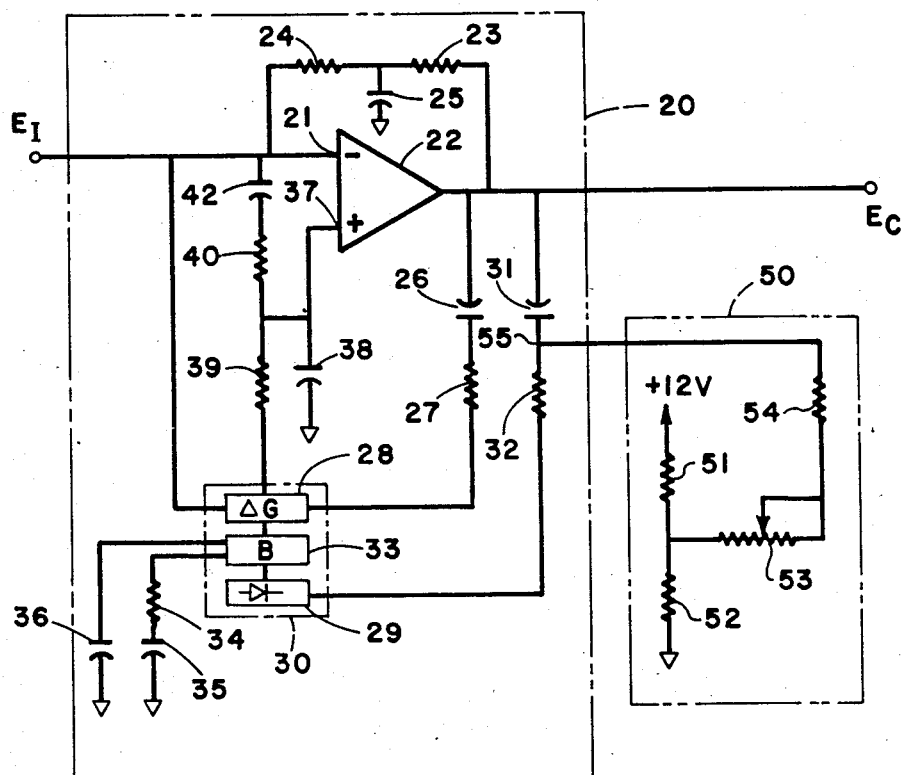
FIG. 2 is a schematic diagram of the compressor of the embodiment of the present invention including a threshold level downward expansion mistracking network.
Figure 3:
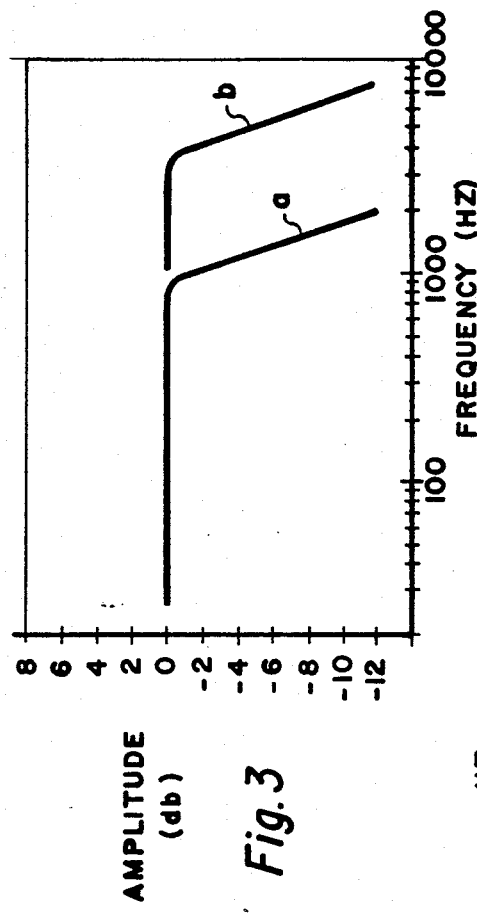
FIG. 3 is an illustration of the impact of control signal amplitude variations on the bandwidth of the output signal of the embodiment of the present invention.

Turning to FIG. 2, the circuitry and operation of the compressor 20 can be understood. The input signal $E_I$ fed from the buffer 10 is received at the inverting input 21 of the operational amplifier 22. The output of amplifier 22 is returned via a D.C. negative feedback loop to inverting input 21. The negative feedback loop includes series connected resistors 23 and 24 and a capacitor 25 connected between the resistors 23 and 24 to ground. The capacitor 25 blocks low frequency A.C. feedback to the inverting input 21 of the amplifier 22. The output of the amplifier 22 is also fed via a capacitor 26, which serves as an A.C. coupler, to a resistor 27 which functions as a current limiter, and is connected to the input of a gain cell 28. The output of the gain cell 28 is returned to the inverting input 21 of the amplifier 22. Thus the gain cell 28 functions as an A.C. feedback loop to the amplifier 22.

In order to determine the gain of the amplifier 22, the gain cell 28 responds variably to an input D.C. signal derived by feeding the output signal of the amplifier 22 to a rectifier 29 via a series connected capacitor 31 and resistor 32. The capacitor 31 provides A.C. coupling and the resistor 32 is a current limiter. A buffer 33 is inserted in the D.C. control signal path between the rectifier 29 and the gain cell 28 to permit control or adjustment of attack and release time independently of one another. The attack time of the D.C. control signal is limited by a series connected resistor 34 and capacitor 35 and the release time by a capacitor 36.

The biasing input 37 to the amplifier 22 is connected to ground via a capacitor 38 to eliminate A.C. signals from the biasing input 37, and is also connected through a resistor 39 to the programmable analog device 30. In the preferred embodiment the device 30 is a currently available Programmable Analog Compander, Signetics Company Catalogue No. NE 572. The biasing input 37 is also connected to the inverting input 21 of the amplifier 22 via a series connected resistor 40 and capacitor 42 to provide stability in the operational amplifier 22 below unity gain.

As described, the gain of the amplifier 22 of the compression network 20 is set to provide an output signal $E_C$ compressed at a 2 to 1 ratio constant across the entire range of input audio levels. But the system noise level will be further reduced if signals below a preselected threshold level are less than fully compressed, thus reducing the level of the undesired signal. To accomplish this, a counterfeit D.C. signal is introduced into the rectifier input along with the A.C. coupled compressed signal. The mistracking device 50 consists of a voltage divider including resistors 51 and 52 series connected through a potentiometer 53 and a resistor 54 to the input circuit of the rectifier 29 at a connection point 55. The potentiometer 53 is adjusted so that a comparatively weak counterfeit D.C. signal combines with the A.C. compressed signal in the rectifier 29. Therefore, high levels of A.C. signal overwhelm the counterfeit D.C. signal and the effect of the counterfeit signal on the D.C. control signal is negligible. But at the predetermined lower levels of A.C. signal, the input of the counterfeit signal becomes significant, causing the compressor 20 to mistrack. Thus, the lower level signal is not compressed to the extent it would have been had the true D.C. control signal been transmitted to the gain cell 28.

This performance can be enhanced by controlling the bandwidth of the input signal $E_I$ with a signal derived from the compressed signal $E_C$ which is desensitized to amplitude changes in the input signal $E_I$.

Figure 4:
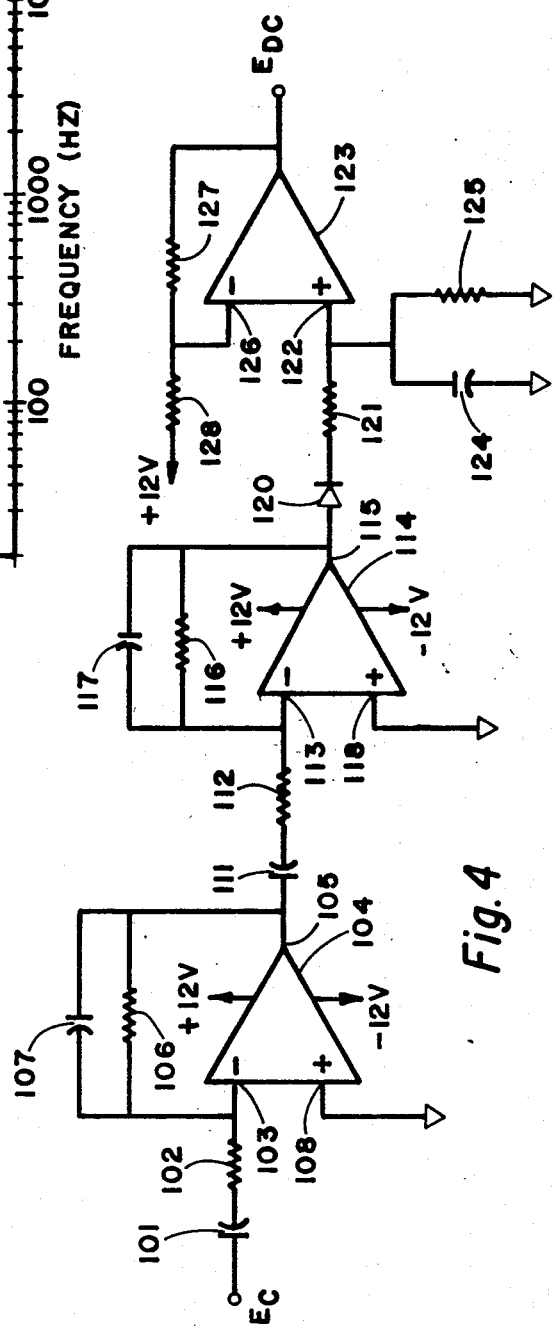
FIG. 4 is a schematic diagram of the low pass filter control signal system of the embodiment of the present invention.

The input $E_I$ is fed to the low pass filter system 90 which, in the absence of high frequency information, reduces the bandwidth of the output signal, the amount of bandwidth reduction being a controllable variable. There are several known ways of achieving this variably controlled filtering effect, such as the use of operational transconductance amplifiers or multiplier circuits functioning essentially as variable resistors. As their resistance increases, the filter system cuts off more high frequency information. By use of a two stage system, a 12 db per octave attenuation slope can be obtained rather than the usual 6 db per octave slope. Curve a of FIG. 4 illustrates a filter turndown frequency of 1 kHz at a 12 db per octave slope. If more high frequency information were available, the filter turndown frequency would increase, as illustrated by curve b. The greater attenuation slope permits more noise attenuation in frequency ranges at which the ear is most sensitive.

Thus, it can be seen that, if the signal $E_{DC}$ controlling the voltage controlled filter is increased, the output bandwidth of the filter system 90 will be increased and, conversely, if the signal $E_{DC}$ controlling the filter is decreased, the output bandwidth will be decreased.

Furthermore, if this variation in control signal amplitude is made to be a function of variations in the signal frequency or amplitude of the input signal $E_I$, then bandwidth control will respond to changes in either or both of these criteria.

To accomplish this, a low pass filter control signal system 100 as shown in FIG. 4 is provided. The output signal $E_C$ of the compressor 20 is A.C. coupled to the control signal system 100 by a capacitor 101 which is series connected to a resistor 102. The capacitor 101 and resistor 102 further serve to filter those low frequency signals which are to have no effect on the control of the low pass filter 90. That is, the 3 db point for filtering low frequencies out of the control signal is established. This filtered signal is fed to the inverting input 103 of an amplifier 104. The output 105 of the amplifier 104 is fed back via a resistor 106 to its inverting input 103 and a capacitor 107 connected in parallel with the resistor 106 provides operational amplifier stability. The amplifier 104 is referenced to ground at its biasing input 108. Some gain is provided due to the relationship of the resistors 102 and 106, and a 6 db per octave attenuation slope of low frequencies is established by this filter.

The output of this filter is fed through a similarly functioning filter consisting of an A.C. coupling capacitor 111 series connected through resistor 112 to the inverting input 113 of an amplifier 114. The amplifier output 115 is fed back via a resistor 116 to the inverting input 113 and a capacitor 117 is connected in parallel across the resistor 116. The biasing input 118 is referenced to ground. Further gain is provided by this amplifier and a 12 db per octave attenuation slope is now established by the two pole filter, as is shown in FIG. 5.

The output of the two filter stages is fed to a rectifier 120. The resulting rectified signal is fed through a resistor 121 to the input 122 of an amplifier 123. A capacitor 124 connects the input 122 to ground and, with resistor 121, sets the attack time of the voltage control filter 90. A resistor 125 also connects the input 122 to ground and, with capacitor 124, sets the release time of the voltage controlled filter 90. The grounding resistor 125 also serves as a D.C. bias to the amplifier input 122. The attack resistor 121 and release resistor 125 are chosen to permit rapid attack and slow release times. For lower levels of input signals to the rectifier 120, the capacitor 124 will discharge very slowly. Feedback to the inverting input 126 is provided via a resistor 127. The inverting input 126 is also connected via a resistor 128 to a 12 volt bias. The resulting output $E_{DC}$ of the D.C. control circuit 100 to which the voltage controlled filter 90 responds varies from approximately minus 8 volts to ground and increases as the level or frequency of the input signal $E_I$ increases.

Figure 5:
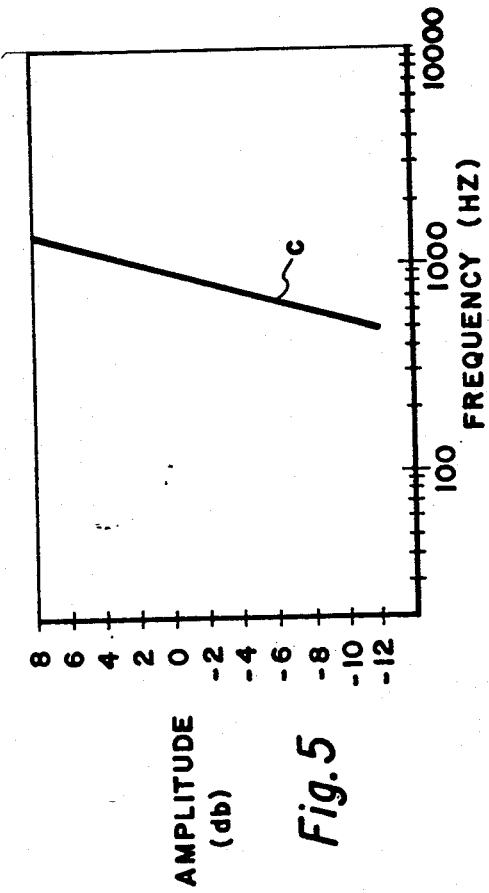
FIG. 5 is an illustration of the impact of input signal frequency and amplitude variations on the amplitude of the control signal to the variably controlled filter of the embodiment of the present invention.

In FIG. 5, the attenuation curve c of the control signal system is shown with an attenuation slope of 12 db per octave due to the two pole filter. It can easily be seen in reference to curve c that decreases in frequency or amplitude of the input signal $E_I$ result in attenuation of the output signal $E_{DC}$. Conversely, increases in frequency or amplitude of the input signal $E_I$ would result in increases in the level of the output control signal $E_{DC}$. Thus, the system is seen to be responsive to both the level and quantity of formation contained in the applicable bandwidth.

Considering the embodiment of the system described in FIGS. 1 through 5 as a whole, the responsiveness of the system to variations in both input signal frequency and amplitude can be appreciated.

Since the compressor 20 is responsive to variations in amplitude in the input signal $E_I$, the input signal $E_I$ received by the low pass variably controlled filter 90 contains reduced levels of noise at all frequencies above the filter cut-off. The variably controlled low pass filter 90 cuts off high frequency noise in response to the filter control network 100. Since the filter control network 100 itself includes a high pass filter system, low frequency surges in the input signal $E_I$ will not affect the variable high frequency cut off points. In addition, the combination of this compressor 20 with the low pass filter 90 variably controlled by the filter control network 100 provides a result beyond the sum of the results of the components. Since the input signal to the control network 100 is actually the compressed output signal $E_C$ of the compressor 20, the sensitivity of the low pass filter 90 to changes in amplitude of the input signal $E_I$ above cut off low frequencies is reduced.

Figure 6:
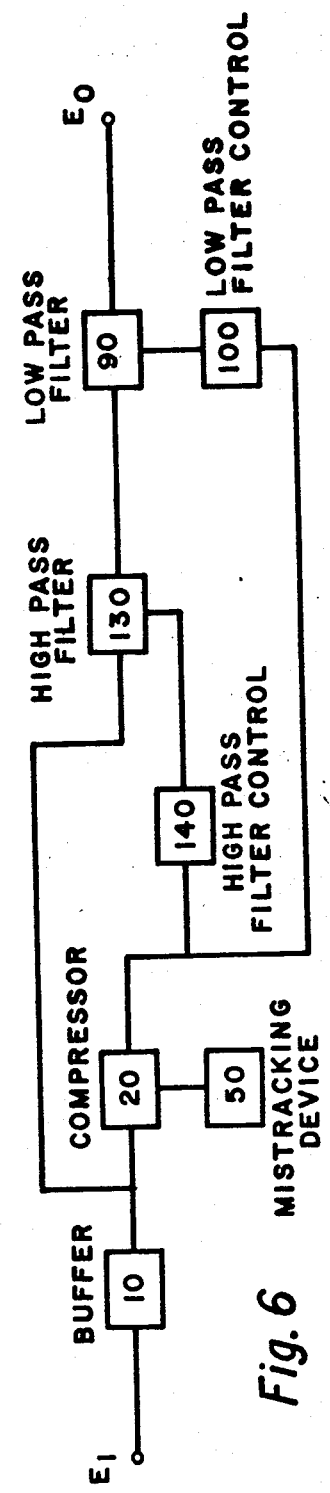
FIG. 6 is a block diagram of an embodiment of the present invention using dynamically controlled low pass and high pass filtering.

It should also be noted, in reference to FIG. 6, that the principles of the above described embodiment can be conversely applied to provide a high pass filter 130 variably controlled by a filter control network 140 including its own low pass filtering system. Thus, high frequency surges in the input signal $E_I$ will not affect the variable low frequency cutoff point. And, of course, the sensitivity of the high pass filter 130 to changes in amplitude of the input signal $E_I$ is also reduced due to the use of the compressed signal.

It will be apparent to those skilled in the art that many alternatives may be chosen and modifications made in the invention herein described without departing from the scope of the invention. All matter contained in this description or shown in the drawings is illustrative and not a limitation of the scope of the invention. Accordingly, it is intended that the scope of this invention includes all such alternatives and modifications as are apparent from the description or drawings or the appended claims.

What is claimed is:

1. A noise reduction system for an input signal comprising:

means for compressing said input signal, said compressing means having a first means for sensing said compressed signal and for providing a D.C. signal to said compressing means responsive to said compressed signal to control compression;

means for filtering said input signal over a variably extended range of frequencies; and second means for sensing said compressed signal and for providing a D.C. signal to said filtering means responsive to levels and quantities of information in a preselected frequency band of said compressed signal to extend the bandwidth of said filtering means when said compressed signal contains more than a predetermined level or quantity of information and to reduce the bandwidth of said filtering means when said compressed signal contains less than a predetermined level or quantity of information.

2. A system in accordance with claim 1 wherein said filtering means is adapted to pass low frequency signals over a variably increasing bandwidth and said second sensing means is adapted to respond to levels and quantities of high frequency information.

3. A system in accordance with claim 1 wherein said filtering means is adapted to low pass filter said input signal and said second sensing means is adapted to high pass filter said compressed signal.

4. A system in accordance with claim 1 wherein said filtering means is adapted to pass low frequency signals over a first variably increasing bandwidth and to pass high frequency signals over a second variably increasing bandwidth and said second sensing means is adapted to respond to levels and quantities of high frequency information to control said first variably increasing bandwidth and to respond to levels and quantities of low frequency information to control said second variably increasing bandwidth.

5. A noise reduction system for an input signal comprising:

means for compressing said input signal, said compressing means having a first means of sensing said compressed signal and providing a D.C. signal to said compressing means responsive to said compressed signal to control compression;

means for low pass filtering said input signal over a variably extended range of frequencies; and second means for sensing said compressed signal, for high pass filtering said compressed signal and for providing a D.C. signal to said low pass filtering means responsive to levels and quantities of high frequency information in said filtered compressed signal to extend the bandwidth of said low pass filtering means when said compressed signal contains more than a predetermined level or quantity of high frequency information and to reduce the bandwidth of said low pass filtering means when said compressed signal contains less than a predetermined level or quantity of high frequency information.

6. A system in accordance with claim 5 further comprising:

means for high pass filtering said input signal over a variably extended range of frequencies; and third means for sensing said compressed signal, for low pass filtering said compressed signal and for providing a D.C. signal to said high pass filtering means responsive to levels and quantities of low frequency information in said filtered compressed signal to extend the bandwidth of said high pass filtering means when said compressed signal contains more than a predetermined level or quantity of low frequency information and to reduce the bandwidth of said high pass filtering means when said compressed signal contains less than a predetermined level or quantity of low frequency information.

7. An extended response dynamically controlled noise reduction system for an input signal comprising:
   means for compressing said input signal, said compressing means having a first means for sensing said compressed signal and for providing a D.C. signal to said compressing means responsive to said compressed signal to control compression;
   means for low pass filtering said input signal over a variably increasing bandwidth;
   second means for sensing said compressed signal, for high pass filtering said compressed signal and for providing a D.C. signal to said low pass filtering means responsive to levels and quantities of high frequency information in said filtered compressed signal to extend the bandwidth of said low pass filtering means when said compressed signal contains more than a predetermined level or quantity of high frequency information and to reduce the bandwidth of said low pass filtering means when said compressed signal contains less than a predetermined level or quantity of high frequency information;
   means for high pass filtering said input signal over a variably increasing bandwidth; and
   third means for sensing said compressed signal, for low pass filtering said compressed signal and for providing a D.C. signal to said high pass filtering means responsive to levels and quantities of low frequency information in said filtered compressed signal to extend the bandwidth of said high pass filtering means when said compressed signal contains more than a predetermined level or quantity of low frequency information and to reduce the bandwidth of said high pass filtering means when said compressed signal contains less than a predetermined level or quantity of low frequency information.

8. A method of conditioning an input signal comprising the steps of:
   compressing said input signal by a gain responsive to a composite D.C. control signal;
   providing a first D.C. signal having a level varying in response to the amplitude of said compressed signal;
   providing a weak D.C. signal in comparison to said first D.C. signal;
   combining said first D.C. signal and said weak D.C. signal to form said composite D.C. control signal;
   providing a second D.C. signal having a level varying in response to the amplitude and frequency of said compressed signal; and
   filtering said input signal over a preselected bandwidth variably extendable in response to increase in the level of said second D.C. signal.

9. A method according to claim 8 further comprising the step of high pass filtering said compressed signal, said second D.C. signal having a level varying in response to the amplitude and frequency of said high pass filtered signal.

10. A method according to claim 9 further comprising the steps of:
   low pass filtering said compressed signal;
   providing a third D.C. signal having a level varying in response to the amplitude and frequency of said low pass filtered signal; and
   filtering said input signal over a second preselected bandwidth variably extendable in response to increases in the level of said third D.C. signal.

11. An extended response dynamically controlled noise reduction system for an input signal comprising:
   means for compressing said input signal, said compressing means having a first means for sensing said compressed signal and for providing a D.C. signal to said compressing means responsive to said compressed signal to control compression;
   means for low pass filtering said input signal over a variably extended range of frequencies; and
   second means for sensing said compressed signal, for high pass filtering said compressed signal and for providing a D.C. signal to said low pass filtering means responsive to levels and quantities of high frequency information in said filtered compressed signal to extend the bandwidth of said low pass filtering means when said compressed signal contains more than a predetermined level or quantity of high frequency information and to reduce the bandwidth of said low pass filtering means when said compressed signal contains less than a predetermined level or quantity of high frequency information.

12. A method of conditioning an input signal comprising the steps of:
   compressing said input signal by a gain responsive to a first D.C. control signal;
   providing said first D.C. signal having a level varying in response to the amplitude of said compressed signal to control compression;
   providing a second D.C. signal having a level varying in response to the amplitude and frequency of said compressed signal; and
   filtering said input signal over a preselected bandwidth variably extendable in response to increase in the level of said second D.C. signal.

13. A noise reduction system for an input signal comprising:
   means for compressing said input signal, said compressing means having a first means for sensing said compressed signal and for providing a D.C. signal to said compressing means responsive to said compressed signal to control compression;
   means for deriving a conditioned signal from said input signal;
   means for filtering said conditioned signal over a variably extended range of frequencies; and
   second means for sensing said compressed signal and for providing a D.C. signal to said filtering means responsive to levels and quantities of information in a preselected frequency band of said compressed signal to extend the bandwidth of said filtering means when said compressed signal contains more than a predetermined level or quantity of information and to reduce the bandwidth of said filtering means when said compressed signal contains less than a predetermined level or quantity of information.

14. A system in accordance with claim 13 wherein said filtering means is adapted to pass low frequency signals over a variably increasing bandwidth and said second sensing means is adapted to respond to levels and quantities of high frequency information.

15. A system in accordance with claim 13 wherein said filtering means is adapted to low pass filter said input signal and said second sensing means is adapted to high pass filter said compressed signal.

16. A system in accordance with claim 13 wherein said filtering means is adapted to pass low frequency signals over a first variably increasing bandwidth and to pass high frequency signals over a second variably increasing bandwidth and said second sensing means is adapted to respond to levels and quantities of high frequency information to control said first variably increasing bandwidth and to respond to levels and quantities of low frequency information to control said second variably increasing bandwidth.

17. A noise reduction system for an input signal comprising:
   means for compressing said input signal, said compressing means having a first means of sensing said compressed signal and for providing a D.C. signal to said compressing means responsive to said compressed signal to control compression;
   means for deriving a conditioned signal from said input signal;
   means for low pass filtering said conditioned signal over a variably extended range of frequencies; and
   second means for sensing said compressed signal, for high pass filtering said compressed signal and for providing a D.C. signal to said low pass filtering means responsive to levels and quantities of high frequency information in said filtered compressed signal to extend the bandwidth of said low pass filtering means when said compressed signal contains more than a predetermined level or quantity of high frequency information and to reduce the bandwidth of said low pass filtering means when said compressed signal contains less than a predetermined level or quantity of high frequency information.

18. A system in accordance with claim 17 further comprising:
   means for high pass filtering said conditioned signal over a variably extended range of frequencies; and
   second means for sensing said compressed signal, for low pass filtering said compressed signal and for providing a D.C. signal to said high pass filtering means responsive to levels and quantities of low frequency information in said filtered compressed signal to extend the bandwidth of said high pass filtering means when said compressed signal contains more than a predetermined level or quantity of low frequency information and to reduce the bandwidth of said high pass filtering means when said compressed signal contains less than a predetermined level or quantity of low frequency information.

19. An extended response dynamically controlled noise reduction system for an input signal comprising:
   means for compressing said input signal, said compressing means having a first means for sensing said compressed signal and for providing a D.C. signal responsive to said compressed signal to control compression;
   means for deriving a conditioned signal from said input signal;
   means for low pass filtering said conditioned signal over a variably increasing bandwidth;
   second means for sensing said compressed signal, for high pass filtering said compressed signal and for providing a D.C. signal to said low pass filtering means responsive to levels and quantities of high frequency information in said filtered compressed signal to extend the bandwidth of said low pass filtering means when said compressed signal contains more than a predetermined level or quantity of high frequency information and to reduce the bandwidth of said low pass filtering means when said compressed signal contains less than a predetermined level or quantity of high frequency information;
   means for high pass filtering said conditioned signal over a variably increasing bandwidth; and
   third means for sensing said compressed signal for low pass filtering said compressed signal and for providing a D.C. signal to said high pass filtering means responsive to levels and quantities of low frequency information in said filtered compressed signal to extend the bandwidth of said high pass filtering means when said compressed signal contains more than a predetermined level or quantity of low frequency information and to reduce the bandwidth of said high pass filtering means when said compressed signal contains less than a predetermined level or quantity of low frequency information.

20. A method of conditioning an input signal comprising the steps of:
   compressing said input signal by a gain responsive to a composite D.C. control signal;
   providing a first D.C. signal having a level varying in response to the amplitude of said compressed signal;
   providing a weak D.C. signal in comparison to said first D.C. signal;
   combining said first D.C. signal and said weak D.C. signal to form a composite D.C. control signal;
   providing a second D.C. signal having a level varying in response to the amplitude and frequency of said compressed signal;
   deriving a conditioned signal from said input signal; and
   filtering said conditioned signal over a preselected bandwidth variably extendable in response to increase in the level of said second D.C. signal.

21. A method according to claim 20 further comprising the step of high pass filtering said compressed signal, said second D.C. signal having a level varying in response to the amplitude and frequency of said high pass filtered signal.

22. A method according to claim 21 further comprising the steps of:
   low pass filtering said compressed signal;
   providing a third D.C. signal having a level varying in response to the amplitude and frequency of said low pass filtered signal; and
   filtering said conditioned signal over a second preselected bandwidth variably extendable in response to increases in the level of said third D.C. signal.

23. A method of conditioning an input signal comprising the steps of:
   compressing said input signal by a gain responsive to a first D.C. control signal;

providing said first D.C. signal having a level varying in response to the amplitude of said compressed signal to control compression;

providing a second D.C. signal having a level varying in response to the amplitude and frequency of said compressed signal;

deriving a conditioned signal from said input signal; and filtering said conditioned signal over a preselected bandwidth variably extendable in response to increase in the level of said second D.C. signal.

* * * * *